United States Patent [19]

Lopez et al.

[11] Patent Number: 5,408,460
[45] Date of Patent: Apr. 18, 1995

[54] DEVICE FOR PROCESSING SIGNALS IN THE FORM OF PACKETS

[75] Inventors: Pierre Lopez; Thierry Podolak, both of Levallois Perret, France

[73] Assignee: Alcatel Telespace, Nanterre Cedex, France

[21] Appl. No.: 37,413

[22] Filed: Mar. 26, 1993

[30] Foreign Application Priority Data

Mar. 27, 1992 [FR] France ............... 92 03755

[51] Int. Cl.⁶ ............................................. H04J 3/10
[52] U.S. Cl. ...................................... 370/6; 370/94.1; 375/346; 375/349
[58] Field of Search ............ 370/6, 94.1, 94.2, 32, 370/60, 60.1; 375/99, 101, 102, 104, 103

[56] References Cited

U.S. PATENT DOCUMENTS

| | | | |
|---|---|---|---|
| 2,917,509 | 11/1959 | Hughes | 370/6 |
| 3,953,802 | 4/1976 | Morris et al. | 375/104 |
| 4,330,859 | 5/1982 | Takada | 370/113 |
| 4,532,636 | 7/1985 | Wilkinson | 375/104 |
| 4,551,688 | 11/1985 | Craiglow | 330/280 |
| 4,574,252 | 3/1986 | Slack | 330/281 |
| 4,755,983 | 7/1988 | Masak et al. | 370/6 |
| 4,980,660 | 12/1990 | Nakamura et al. | 370/32 |

Primary Examiner—Wellington Chin
Attorney, Agent, or Firm—Sughrue, Mion, Zinn, Macpeak & Seas

[57] ABSTRACT

The invention concerns a device for processing signals in the form of successive packets sent in successive time slots of the type comprising a processing system including at least one processing member with secondary effects (81, 82) likely to generate disturbances affecting adjacent packets. Two processor members (81, 82) with secondary effects are disposed in separate channels (90, 91) and switching means (83, 84) cyclically connect the separate channels each during one time slot and disconnect them between times so that a channel connected to process a packet cannot be disturbed by adjacent packets each processed by another channel.

7 Claims, 5 Drawing Sheets

DEVICE FOR PROCESSING SIGNALS IN THE FORM OF PACKETS

BACKGROUND OF THE INVENTION

The invention concerns devices for processing signals in the form of packets and in particular devices of this kind using a processor member having secondary effects likely to generate disturbances affecting adjacent packets.

Devices of this kind are used in time-division multiple access (TDMA) system receivers, for example. The TDMA technique is used in the GSM digital cellular radiotelephone system, for example. In a system of this kind mobile stations communicate by radio with fixed base stations which are connected into the conventional telecommunication network. Communication between a fixed station and mobile stations within its coverage area uses a two-way frequency channel which is time-shared between a plurality of mobile stations, one time slot in a repetitive frame being assigned to each mobile station. The combination of the time slots of these repetitive frames assigned to a given mobile station in this way is sometimes called a channel time slot. In the mobile station to fixed station direction each mobile station sends a data packet in each time slot assigned to it and at its own level. When received at the fixed station the packets from the various mobile stations, which follow on in sequence in the time slots of each frame, do not all have the same amplitude. Because of varying propagation conditions (different distances, obstacles, etc.) their amplitudes are distributed over a broad dynamic range. These differences in level must be compensated at the input of the fixed station receiver.

A solution proposed by the applicant in French patent application n° 92.03754 filed the same day as this application under the title "Dispositif de commande de gain dans un récepteur de signaux d'information" ("Gain control device in a data signal receiver") uses variable gain amplifier means, evaluator means to receive the input signal and to derive from it an amplitude signal, processor means coupled to the evaluator means, receiving the amplitude signal and deriving from it a gain control signal which is passed to a gain control input of the amplifier means, and a delay line between the signal input and the amplifier means supplying to the latter a delayed input signal such that the gain control signal is available to control the gain in the amplifier means when the latter receive the delayed input signal.

The gain control device in this solution further comprises a filter, for example a band-pass filter, to filter the input signal.

The delay line and the filter just mentioned are two examples of processor members having secondary effects likely to generate disturbances affecting adjacent packets.

There is some unwanted coupling between the input and the output of a delay line. If the delay line conveys consecutive packets, as in the system described, the start of one packet may disturb the end of the previous packet.

A passive analog delay line has another unwanted effect, namely the multiple routing of a signal by reflection of the signal at the output, backwards propagation through the line, reflection at the input and further forward propagation to the output which thus supplies not only the input signal delayed once by the line but also an attenuated replica delayed three times by the line. This may disturb the start of the next packet.

A narrowband analog filter such as a quartz crystal filter is itself subject to a ringing phenomenon which extends the length of a packet and may disturb the start of the next packet.

These unwanted secondary effects can naturally be reduced to the point where they are acceptable, but this entails costly precautions.

Also, the situation just referred to of reception of signals in TDMA systems like the GSM system is merely one example and the man skilled in the art will be aware of many other situations of processing signals in the form of consecutive packets where the same problem arises.

SUMMARY OF THE INVENTION

The present invention provides an effective, simple and low-cost solution to this problem.

To this end the present invention proposes a device for processing signals in the form of successive packets sent in successive time slots of the type comprising a processor system including at least one processor member with secondary effects likely to generate disturbances affecting adjacent packets. This device is characterized in that it comprises at least two processor members with secondary effects disposed in separate channels and switching means cyclically connecting the separate channels to a packet input and a packet output each during one time slot and disconnecting them between times from said packet input and said packet output so that a channel connected to process a packet cannot be disturbed by adjacent packets each processed by another channel.

A separate channel which has just processed a packet is thus disconnected so as not to disturb adjacent packets processed by the other channel(s).

The switching means comprise an upstream switch selectively and cyclically connecting the packet input to an input of one of the set of separate channels and a downstream switch selectively and cyclically connecting an output of one of the separate channels to the packet output. The downstream switches may accomplish their switching operations to the same channels as the upstream channels but with a time difference which represents the signal transit time in one of the separate channels.

Additionally and advantageously the switching means are adapted not only to connect selectively one of the separate channels but also to connect a dissipative load to each non-selected channel.

As previously mentioned, the members with secondary effects comprise a delay line and/or a narrowband filter.

In a simple embodiment the number of separate channels is two and the two separate channels are used alternately by means of changeover switches.

Other features and advantages of the invention will emerge from the following description of embodiments thereof given by way of non-limiting example only with reference to the appended figures which show:

DESCRIPTION OF PREFERRED EMBODIMENTS

Figure 1:
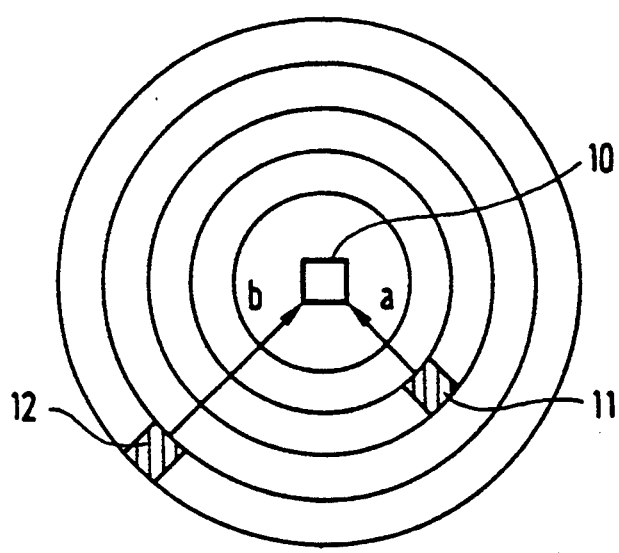
FIG. 1, the situation of mobile stations relative to a fixed station in a TDMA type system, FIG. 2, the TDMA frame received by the fixed station in FIG. 1, FIG. 3, one embodiment of a data signal receiver in which use of the present invention is desirable, FIG. 4, successive packets and the unwanted secondary effects likely to be produced by a delay line, FIG. 5, successive packets and the unwanted secondary effects likely to be produced by a highly selective filter, FIGS. 6A, 6B, 6C, a signal processor device in accordance with the invention in three different operating positions, FIG. 7, a signal processor device in accordance with the invention, combining filtering and time-delay functions, as used in the receiver from FIG. 3.

FIG. 1 shows a transmission system including a fixed base station 10 and two mobile stations 11 and 12 at different distances a and b from the base station 10. This combination may be part of a GSM type radiotelephone network, for example.

Figure 2:
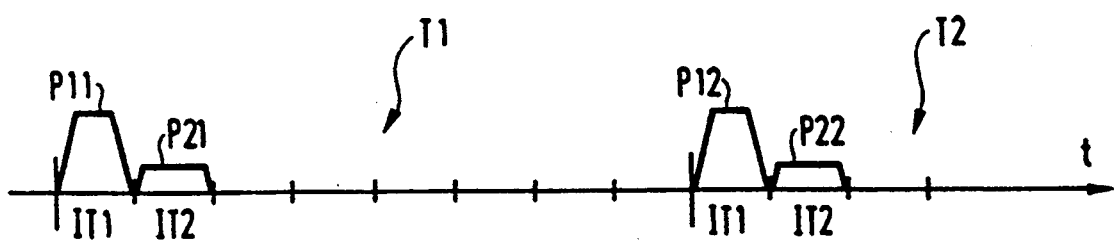

The following description concerns only transmission from the mobile stations 11, 12 to the fixed station 10. Transmission from the mobile stations 11, 12 to the fixed station 10 is by way of packets in a frame of repetitive time slots, as shown in FIG. 2 which shows a frame T1 made up of consecutive time slots IT1, IT2, etc. and the start of a frame T2 comprising the same time slots IT1 and IT2. In the first time slot IT1 of frame T1 the mobile station 11 sends a packet P11. In the time slot IT2 the mobile station 12 sends a packet P21. In the first time slot IT1 of frame IT2 the mobile station 11 sends a new packet P12 which is followed by a packet P22 sent by the mobile station 12, and so on.

Each packet sent is a signal at a frequency assigned to the communication between the mobile station in question and the fixed station modulated by the data to be sent, digital data in the case of a GSM type system.

FIG. 2 shows the signals as received by the fixed station 10. The time position of the successive packets as they arrive at the fixed station may be defined by arrangements that are not described here because they do not form any part of the present invention.

What is important is that the packets received from the different mobile stations have different amplitudes. The mobile station 11 is relatively near the fixed station 10. The amplitude of the signal that the fixed station 10 receives in the time slot IT1 is therefore relatively high. The mobile station 12, on the other hand, is relatively far away and the amplitude of the signal that the fixed station receives in the time slot IT2 is relatively low.

The distance is naturally not the only factor affecting the amplitude of the signals received by the fixed station 10; others include the presence of obstacles to propagation, multipath fading, etc.

Figure 3:
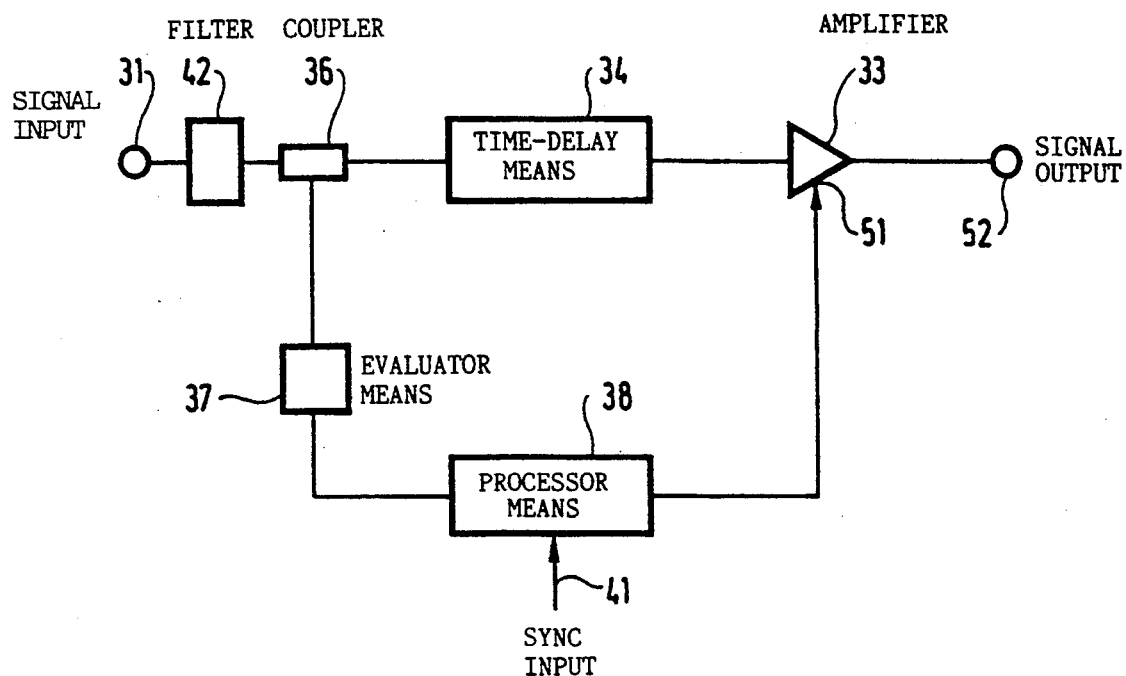

The problem arises of reducing the dynamic range of received signals having a broad dynamic range before they are processed, for example to recover the analog or digital data that they convey. This problem is covered in detail in the previously mentioned copending patent application and the solution proposed therein is shown in FIG. 3. This shows part of a signal receiver including:

a signal input 31 receiving an input data signal which may be the antenna signal of the fixed station 10 from FIG. 1 as shown in FIG. 2, variable gain amplifier means 33 coupled to the input 31 to receive the input data signal and adapted to modify its level according to a gain control signal received at a gain control input 51 to derive from it an output data signal, a signal output 52 coupled to the amplifier means 33 and supplying the output data signal, evaluator means 37 coupled to the input 31 to receive the input data signal and adapted to derive from it an amplitude signal dependent on the level of the latter signal, and processor means 38 coupled to the evaluator means 37, receiving the amplitude signal and deriving from it a gain control signal according to a predefined gain control law, which gain control signal is passed to the gain control input 51 of the amplifier means 33.

FIG. 3 further shows a coupler 36 splitting the input data signal between the branch comprising the amplifier means 33 and the branch which includes the evaluator means 37 and processor means 38.

The evaluator means 37 may be an envelope detector and the processor means 38 may be of various kinds, as explained in the copending patent.

The variable gain amplifier means 33 may comprise a series of amplifier stages between which are variable attenuator stages. In this case the gain is varied by the attenuators.

These various means are such that the output data signal has a reduced dynamic range as compared with the input data signal as shown in FIG. 2.

The FIG. 3 receiver further comprises a delay line 34; it is disposed between the signal input 31 and the amplifier means 33 and supplies to the latter an input signal delayed by an amount such that the gain control signal is available to control the gain in the amplifier means 33 when the latter receive the delayed input signal.

FIG. 3 also shows filter means 42. In some cases the input signal comprises out-band interference signals which would affect the amplitude evaluation if they were not eliminated. The solution is to filter them out using a band-pass filter, for example. A filter of this kind may be inserted between the input 31 and the coupling point 36.

Figure 4:
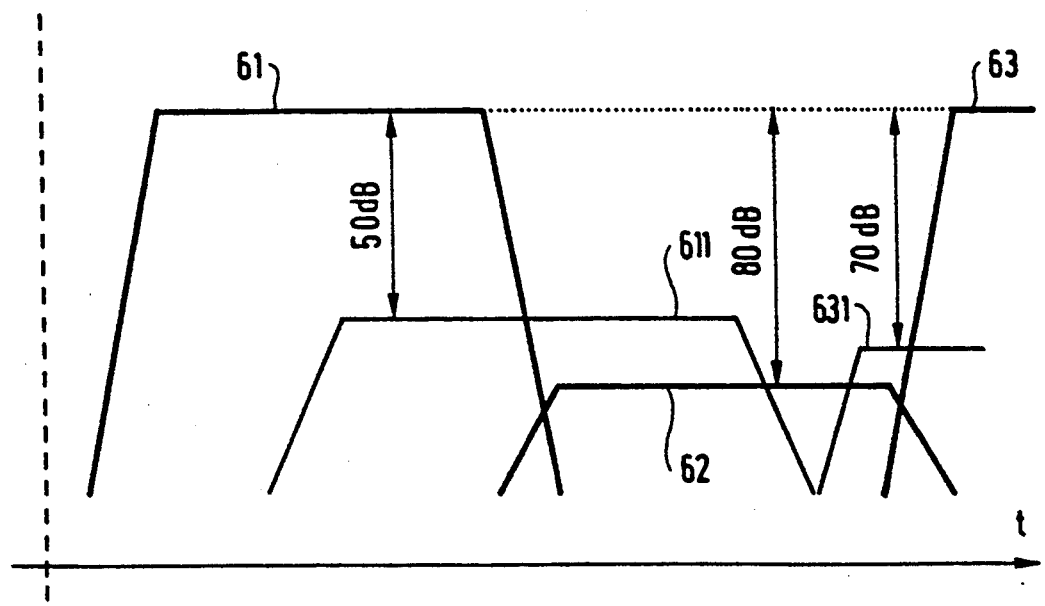

Reference will now be had to FIG. 4 to explain briefly the unwanted secondary effects likely to be introduced by the delay line 34 of the receiver 34 from FIG. 3.

FIG. 4 shows successive packets 61, 62, 63 as observed at the output of the delay line 34. For the purposes of the demonstration two high-amplitude packets 61 and 63 have been selected between which is a low-amplitude packet 62. Its level is 80 dB lower than that of the two adjacent packets 61 and 63.

Because of the direct coupling between the input and the output of the delay line 34 the packet 63 gives rise to an unwanted secondary effect in the form of a replica 631 attenuated by the amount of input/output isolation (this is 70 dB in this example), which is leading the wanted signal because it has not been delayed and which disturbs the end of the preceding packet 62 because its level is still higher than that of the latter.

Because of the multiple transmission through the delay line 34 the packet 61 is itself followed by a replica 611 attenuated by a greater or lesser amount dependent on the quality of the delay line (usually from 30 to 50 dB, and 50 dB in the example shown in the figure) and delayed by an amount which is three times the time-delay of the delay line; this disturbs the start of the packet 62.

Given these conditions, it is seen that the packets are not acceptable because they are disturbed too much by the high-amplitude packets between which they may lie. A costly solution is careful input/output decoupling and matching at the line input and output, which is costly and does not totally eliminate the disturbing effects.

Figure 5:
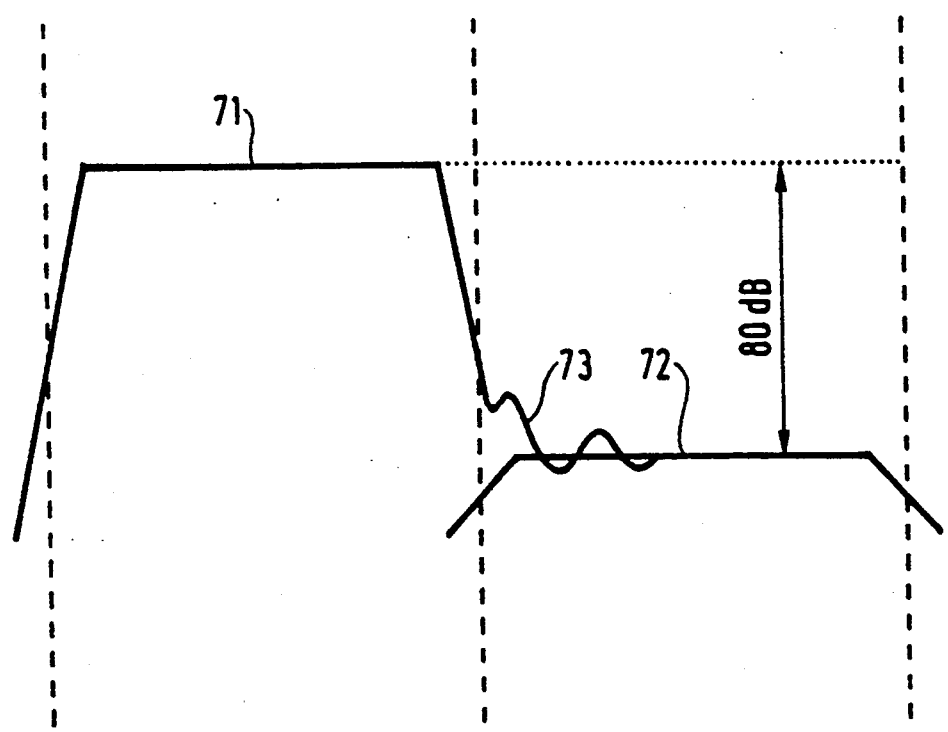

FIG. 5 shows in the same way how the filter 42 of the receiver from FIG. 3 may produce an unwanted secondary effect, in this instance ringing 73 such that a high-amplitude packet 71 disturbs a low-amplitude packet 72. Again the preventive measures required are costly and only partially effective.

The invention therefore proposes an alternative solution that will now be described with reference firstly to FIGS. 6A, 6B and 6C. According to this solution two processor members with secondary effects 81, 82 are disposed in separate channels and switching means 83, 84 connect the separate channels cyclically to the packet input 80 and packet output 87, each during a time slot corresponding to one packet, disconnecting them in between times from the packet input 80 and packet output 87 so that a channel connected to process one packet cannot be disturbed by adjacent packets, each processed by another channel.

Figure 6A:
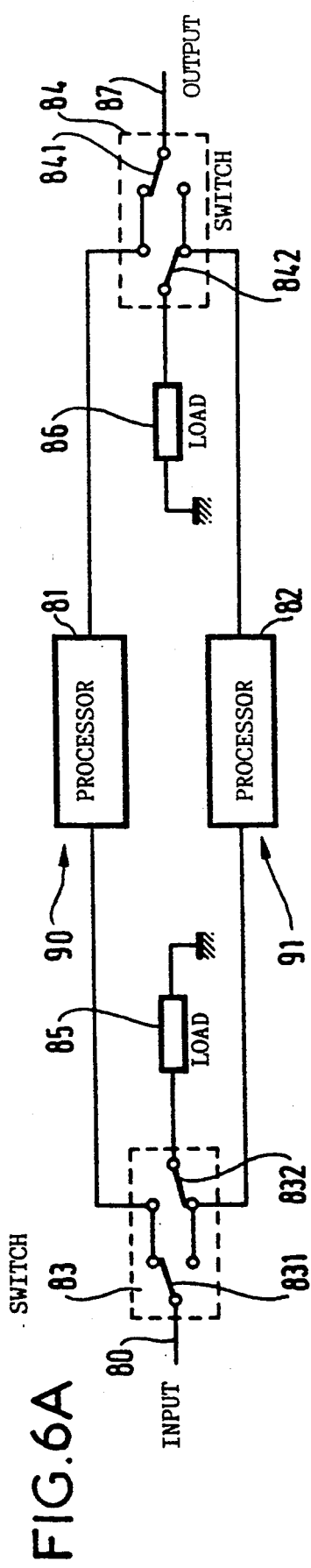

In a first example the processor device of FIG. 6A is intended to replace the delay line 34 of the receiver from FIG. 3. It comprises a packet input 80, an upstream switch 83, two separate channels 90, 91, a downstream switch 84 and a packet output 87. In the FIG. 3 receiver the packet input 80 would be connected to the coupling device 36 and the packet output 87 to the amplifier means 33.

In a second example the processor device of FIG. 6A is adapted to replace the highly selective band-pass filter 42 of the FIG. 3 receiver. The packet input and output are then connected accordingly and the processor members 81 and 82 are two filters like the filter 42 from FIG. 3.

Figure 6B:
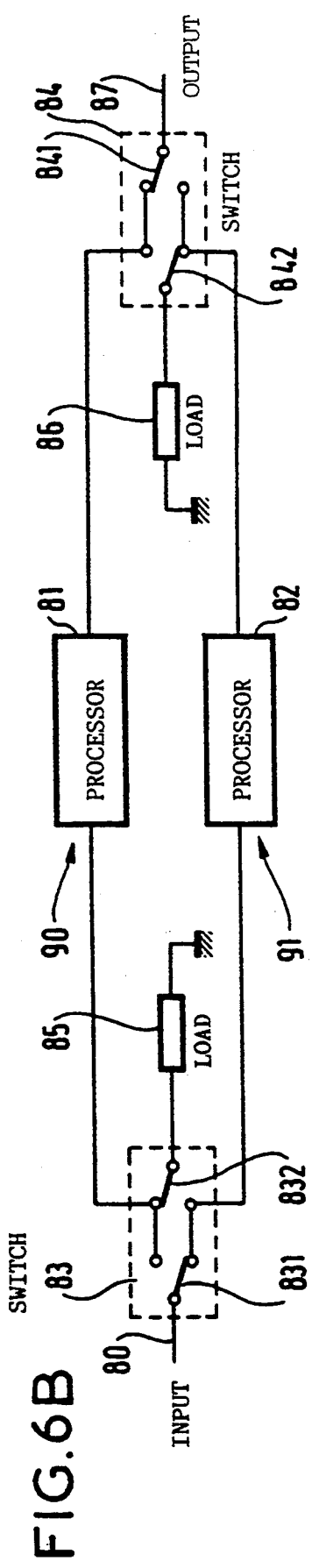
Figure 6C:
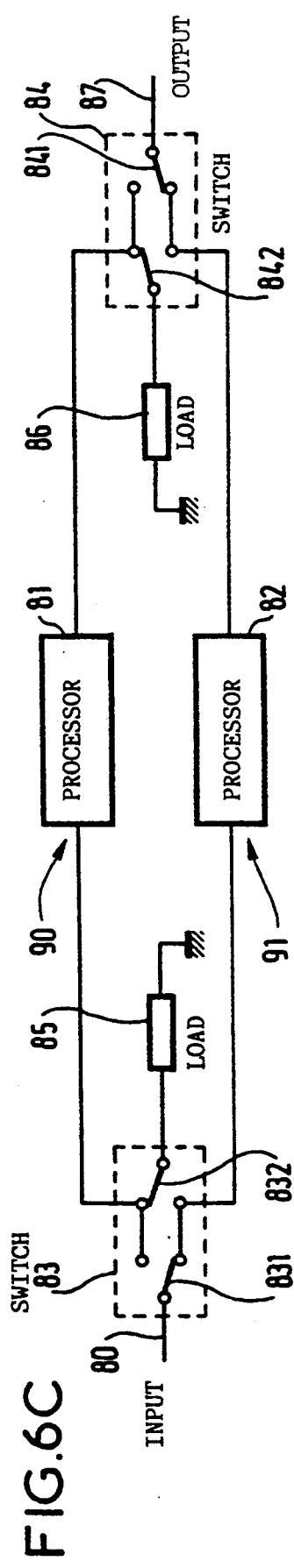

FIGS. 6B and 6C show the same device as FIG. 6A with the switches 83 and 84 in different positions.

With the switches 83 and 84 in the positions shown in FIG. 6A the channel 90 is in service and the channel 91 is not. A packet is processed by the channel 90. The previous packet was processed by the channel 91 and the next packet will also be processed by the channel 91. As the channel 91 is not in circuit, neither the preceding packet nor the subsequent packet can disturb the packet being processed. All that is required to achieve this is that the switches 83 and 84 are operated at the appropriate times. If the device of FIG. 6A represents the filter 42 of FIG. 3, which may be considered as having a null propagation time, the switches 83 and 84 may be operated simultaneously, in other words synchronously, and leave the position shown in FIG. 6A at the end of a packet to move directly to the position shown in FIG. 6C. The channel 91 is then in service for the next packet instead of the channel 90. The disconnected channel 90 cannot disturb this next packet, and so on.

If the device of FIG. 6A represents the delay line 34 from FIG. 3 the upstream and downstream switches must operate sequentially and before reaching the FIG. 6C state they pass through the FIG. 6B state; at the end of a packet, as observed at the switch 83, the latter must change position although, because of the time-delay introduced by the delay line, it is not yet the end of the packet at the switch 84. It is only after the end of the packet processed by the channel 90, as seen at the switch 84, that the state shown in FIG. 6C is achieved. Note that disconnection of the input of the channel 90 at the end of the packet prevents the next packet disturbing the end of the packet processed by the channel 90 by input/output coupling via the member 81. Likewise, the input/output coupling via the member 82 will not have any disturbing effect because the output of the member 82 is not yet connected (see FIG. 6B). Then, the output of the channel 90 being disconnected at the end of the packet that it has just processed (see FIG. 6C), any three times delayed replica cannot have any disturbing effect either.

The switch 83 comprises two changeover switches 831 and 832 and the switch 84 comprises two changeover switches 841 and 842. The changeover switches 831 and 841 connect and disconnect the separate channels 90 and 91 as already described. The changeover switches 832 and 842 connect the unconnected channel to a respective dissipative load 85 and 86. This arrangement enables rapid dissipation of energy contained in the unconnected processing member in order to remove the risk of it causing any disturbance subsequently.

Finally, FIGS. 6A, 6B and 6C concern the provision of two separate channels, which is based on the assumption that any disturbing effect by one channel cannot extend further than the duration of one packet, which conforms to what is shown in FIGS. 4 and 5. The invention would apply equally well to the situation in which three or more channels were required, subject to the provision of switching arrangements that will be obvious to the man skilled in the art.

Figure 7:
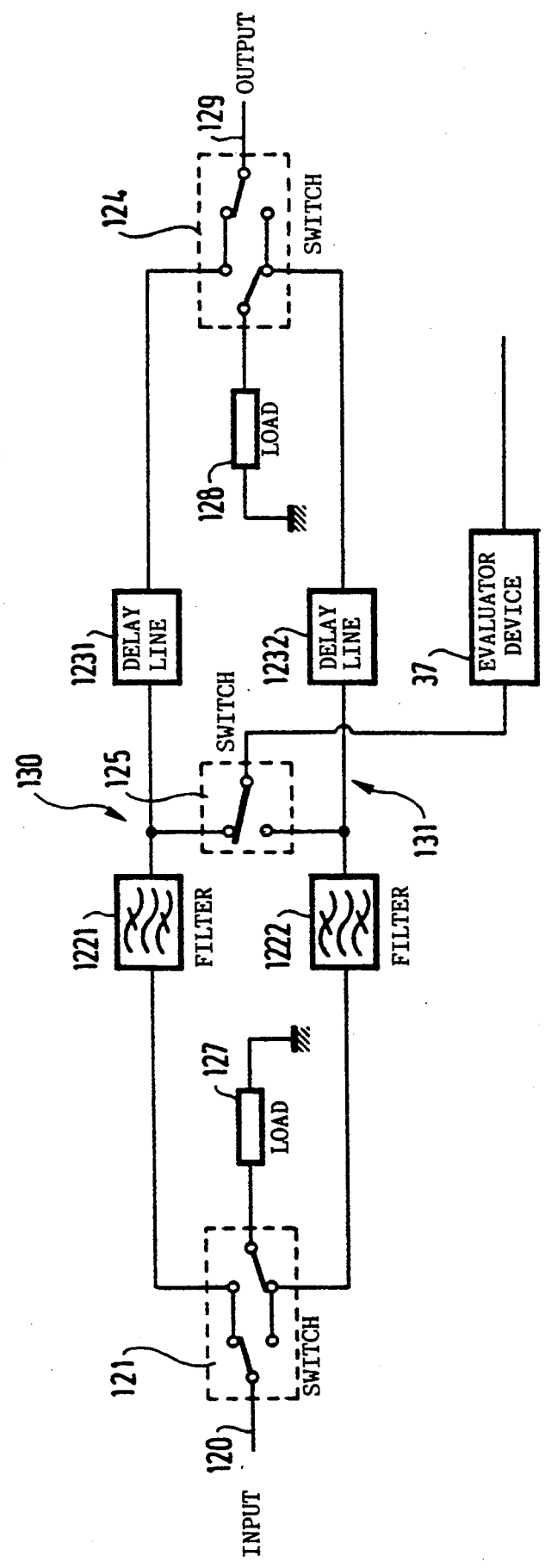

There will now be described with reference to FIG. 7 one embodiment of the invention combining the means related to the processor members 34 and 42 of the FIG. 3 receiver.

A single processor device comprises, like those of FIG. 6A, 6B, 6C, an input 120, an upstream switch 121, two separate channels 130 and 131, a downstream switch 124, dissipative loads 127 and 128, and an output 129. Each separate channel comprises a filter 1221, 1222 and a delay line 1231, 1232. The operation of this system is deducible directly from that just described with reference to FIGS. 6A, 6B and 6C. Additionally, for connecting the evaluator device 37, a switch 125 samples part of each packet in the channel in which it is processed each time.

What is claimed is:

1. A device, for processing signals in the form of successive packets sent in a plurality of successive time slots, said device comprising a processing system including:
   at least two processor members with secondary effects likely to generate disturbances affecting adjacent packets, and disposed in separate channels; and
   switching means cyclically connecting said separate channels to a packet input a packet output, each during one of said successive time slots, and disconnecting said separate channels, between times, from said packet input and said packet output so that each channel, when connected to process a packet, cannot be disturbed by adjacent packets processed by another of said channels.

2. The device according to claim 1, wherein said switching means comprises an upstream switch, selectively and cyclically connecting said packet input to an input of one of said separate channels, and a downstream switch selectively and cyclically connecting an output of one of said separate channels to said packet output.

3. The device according to claim 2, wherein said downstream switch switches to the same separate channel as said upstream switch but with a time difference which represents the propagation time of signals in said separate channel.

4. The device according to any one of claims 1 to 3 wherein said switching means not only selectively connects one of said separate channels but also connects a dissipative load to each unselected one of said channels.

5. The device according to claim 1, wherein said processor members with secondary effects comprise a delay line.

6. The device according to claim 1, wherein said processor members with secondary effects comprise a narrowband filter.

7. The device according to claim 1, wherein the number of said separate channels is two, and wherein said two separate channels are alternately connected by said switch means.

* * * * *